(12) United States Patent
Hsieh

(10) Patent No.: US 8,416,020 B1
(45) Date of Patent: Apr. 9, 2013

(54) SWITCHING AMPLIFIER AND SWITCHING AMPLIFYING METHOD

(76) Inventor: Wen-Hsiung Hsieh, Keelung (TW)

( * ) Notice: Subject to any disclaimer, the term of this patent is extended or adjusted under 35 U.S.C. 154(b) by 0 days.

(21) Appl. No.: 13/300,589

(22) Filed: Nov. 20, 2011

(51) Int. Cl.
  *H03F 3/217* (2006.01)
(52) U.S. Cl.
  USPC .......................................................... 330/251
(58) Field of Classification Search ............... 330/10, 330/207 A, 251
  See application file for complete search history.

(56) References Cited

U.S. PATENT DOCUMENTS

| | | | |
|---|---|---|---|
| 3,629,616 A | 12/1971 | Walker | |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | Mccorkle | |
| 5,781,067 A | 7/1998 | Tota | |
| 5,805,020 A | 9/1998 | Danz | |
| 5,949,282 A | 9/1999 | Nguyen | |
| 5,986,498 A | 11/1999 | Rodriguez | |
| 6,356,151 B1 | 3/2002 | Nalbant | |
| 6,392,476 B1 | 5/2002 | Rodriguez | |
| 6,489,839 B2 | 12/2002 | Maaskant | |
| 6,563,377 B2 | 5/2003 | Butler | |
| 6,661,285 B1* | 12/2003 | Pompei et al. | 330/251 |
| 6,778,012 B2* | 8/2004 | Kirn | 330/251 |
| 6,794,932 B1 | 9/2004 | Butler | |
| 6,844,777 B2 | 1/2005 | Kitamura | |
| 6,922,101 B2 | 7/2005 | Bayko | |
| 7,030,694 B2 | 4/2006 | Jonkman | |
| 7,286,008 B2 | 10/2007 | Watts | |
| 7,307,474 B2 | 12/2007 | Nguyen | |
| 7,400,191 B2 | 7/2008 | Rodriguez | |
| 7,633,336 B2 | 12/2009 | Bean | |
| 7,705,672 B1 | 4/2010 | Rodriguez | |
| 7,816,985 B2 | 10/2010 | Attwood | |
| 7,952,426 B2 | 5/2011 | Mun | |
| 7,961,047 B2 | 6/2011 | Pillonnet | |
| 7,969,126 B2 | 6/2011 | Stanley | |
| 8,203,382 B2* | 6/2012 | Maeda | 330/251 |
| 8,212,613 B1* | 7/2012 | Hsieh | 330/251 |
| 8,228,118 B1* | 7/2012 | Hsieh | 330/251 |
| 2002/0125941 A1* | 9/2002 | Nguyen | 330/251 |

* cited by examiner

*Primary Examiner* — Khanh V Nguyen (57) ABSTRACT

A switching amplifying method or a switching amplifier for obtaining one or more than one linearly amplified replicas of an input signal, is highly efficient, and does not have the disadvantage of "dead time" problem related to the class D amplifiers. Said switching amplifying method comprises the steps of: receiving and pulse modulating the input signal for getting a pulse modulated signal; switching at least one switch to get a pulsed voltage from a direct current voltage according to the pulse modulated signal; keeping the energy transmission to the output signal during the switching off period of said switching via using at least one free-wheeling diode means; conducting said pulsed voltage positively or negatively to a filter according to the polarity of the input signal via a switching power transmitting unit; filtering said pulsed voltage conducted from the switching power transmitting unit for outputting the output signal by the filter.

20 Claims, 6 Drawing Sheets

SWITCHING AMPLIFIER AND SWITCHING AMPLIFYING METHOD

BACKGROUND OF THE INVENTION (1) Field of the Invention

This invention is related in general to a power amplifier, and more particularly, to a switching amplifier that can efficiently and linearly amplify an input signal having first and second polarities for obtaining one or more than one low-distortion output signals.

(2) Description of the Related Art

Amplifiers are electronic devices which are used for increasing the power of a signal, and are generally categorized into various classes. The popular amplifiers include class A, class B and class D amplifiers. Reference is made to the exemplary U.S. Patents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces one or more than one linearly amplified replicas of an input signal, is highly efficient, and does not have the "dead time" problem related to class D amplifiers.

One aspect of the present invention provides a method of obtaining an output signal from a direct current (DC) voltage, wherein the output signal is a linearly amplified replica of an input signal having first and second polarities, comprising the steps of: receiving the input signal; pulse modulating the input signal for getting a pulse modulated signal; switching at least one switch to get a pulsed voltage from the direct current (DC) voltage according to the pulse modulated signal; keeping the energy transmission from the pulsed voltage to the output signal during the switching off period of said switching via using at least one free-wheeling diode means coupled to said at least one switch to provide proper current path for the transmission; conducting said pulsed voltage positively or negatively to a filter according to the polarity of the input signal via a switching power transmitting unit; filtering said pulsed voltage positively or negatively conducted from the switching power transmitting unit for outputting the output signal by the filter.

Another aspect of the present invention, the method of claim 1 further comprising: isolating the direct current (DC) voltage and the output signal via a transformer and at least one rectifier diode means coupled between the switch and said at least one free-wheeling diode means, wherein the transformer comprises a primary winding, a secondary winding unit comprising a secondary winding or two secondary windings, and means for resetting the flux in the core of the transformer to its rest value by transforming the energy of parasitic inductance from the transformer to the direct current (DC) voltage during the switching off period of said switching; the rectifier diode means blocks a current in the secondary winding unit during the switching off period of said switching.

Yet another aspect of the present invention provides a switching amplifier switching amplifier for obtaining an output signal from a direct current (DC) voltage, wherein the output signal is a linearly amplified replica of an input signal having first and second polarities, said amplifier comprising: a switching unit comprising at least one switch for switching a pulsed voltage from the direct current (DC) voltage; a free-wheeling diode unit comprising at least one free-wheeling diode means for providing a current path for transmitting energy from the pulsed voltage to the output signal during the switching off period of the switching unit; a switching power transmitting unit for positively or negatively conducting the pulsed voltage to a filter unit, wherein the switching power transmitting unit comprises a plurality of switches; an amplifier control unit for receiving the input signal and coupled to the switches of the switching unit and the switching power transmitting unit to control their switching according to the input signal; the filter unit to obtain the output signal corresponding to the input signal by filtering the pulsed voltage positively or negatively conducted from the switching power transmitting unit and outputting the output signal.

Yet another aspect of the present invention provides a switching amplifier further comprising one or more than one slave outputs.

Yet another aspect of the present invention provides a switching amplifier further comprising a negative feedback signal generator to generate a negative feedback signal corresponding to the output signal, wherein the amplifier control unit integrates the input signal and the negative feedback signal to process a negative feedback control.

Yet another aspect of the present invention provides a switching amplifier further comprising a rectifying and smoothing unit to rectify and smooth an alternating current (AC) voltage and to provide the direct current (DC) voltage.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
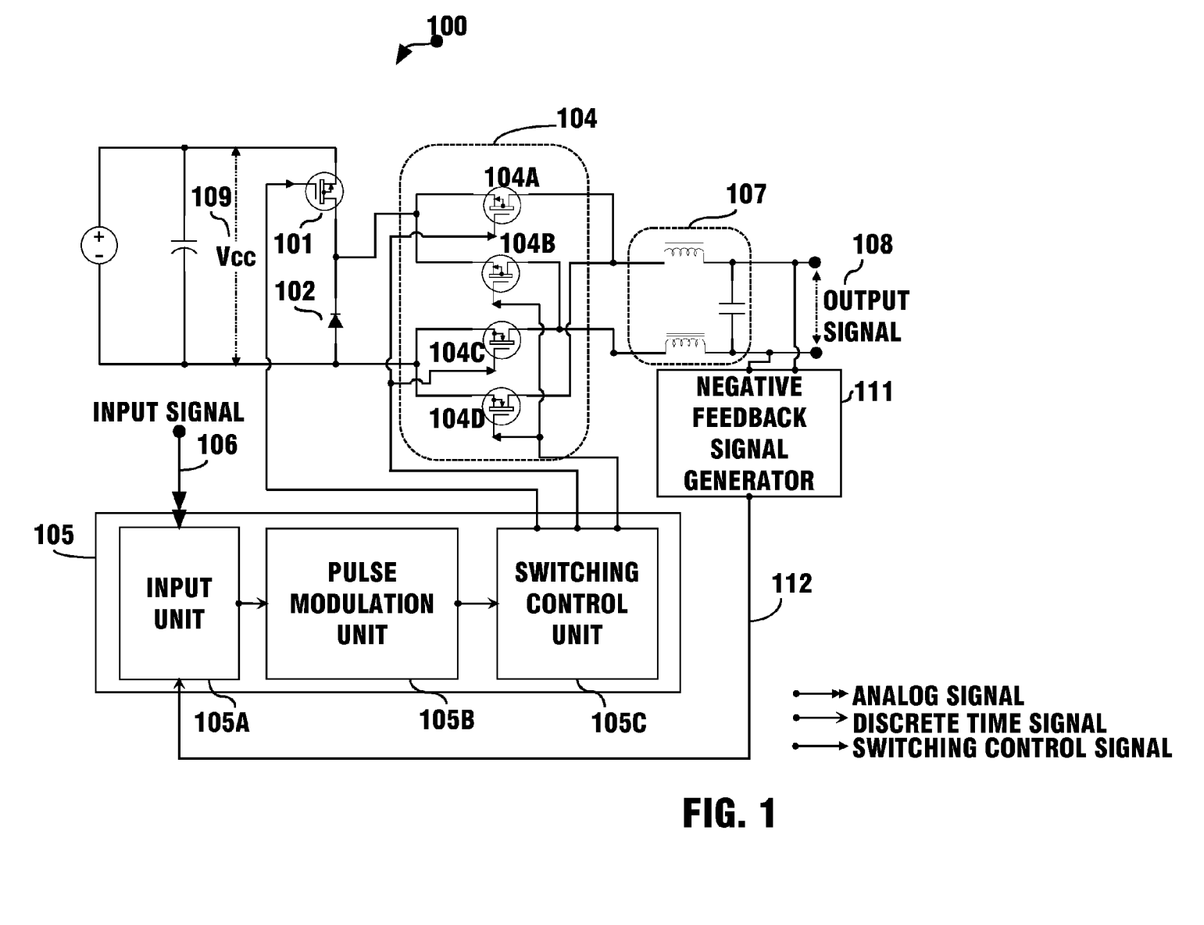
FIG. 1 is an exemplary block and circuit diagram illustrating a first embodiment of a switching amplifier in accordance with the present invention.

FIG. 1 is an exemplary block and circuit diagram illustrating a first embodiment of a switching amplifier in accordance with the present invention.

As illustrated in FIG. 1, the switching amplifier 100 of the present invention for obtaining an output signal 108 from a direct current (DC) voltage 109, wherein the output signal 108 is a linearly amplified replica of an input signal 106 having first and second polarities is comprised of: a switching unit 101 for switching a pulsed voltage from the direct current (DC) voltage 109; a free-wheeling diode unit 102 for providing a current path for transmitting energy from the pulsed voltage to the output signal 108 during the switching off period of the switching unit 101;

a switching power transmitting unit 104 coupled to the switching unit 101 and the free-wheeling diode unit 102 for positively or negatively conducting the pulsed voltage to a filter unit 107, wherein the switching power transmitting unit 104 comprises a plurality of switches 104A, 104B, 104C, 104D; an amplifier control unit 105 for receiving the input signal 106 and coupled to the switches of the switching unit 101 and the switching power transmitting unit 104 to control their switching according to the input signal 106; the filter unit 107 to obtain the output signal 108 corresponding to the input signal 106 by filtering the pulsed voltage positively or negatively conducted from the switching power transmitting unit 104 and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 1, the amplifier control unit 105 comprises an input unit 105A for receiving the input signal 106 and having an analog to digital converter for converting the input signal 106 to a discrete time input signal $x[n]$ $$x=\{x[n]\},\ 0<n<\infty;$$

a pulse modulation unit 105B for getting a pulse modulated signal from pulse modulating the discrete time input signal $x[n]$; and a switching control unit 105C coupled to the switches of the switching unit 101 and the switching power transmitting unit 104 to control their switching according to the pulse modulated signal from the pulse modulation unit 105B.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

Figure 2:
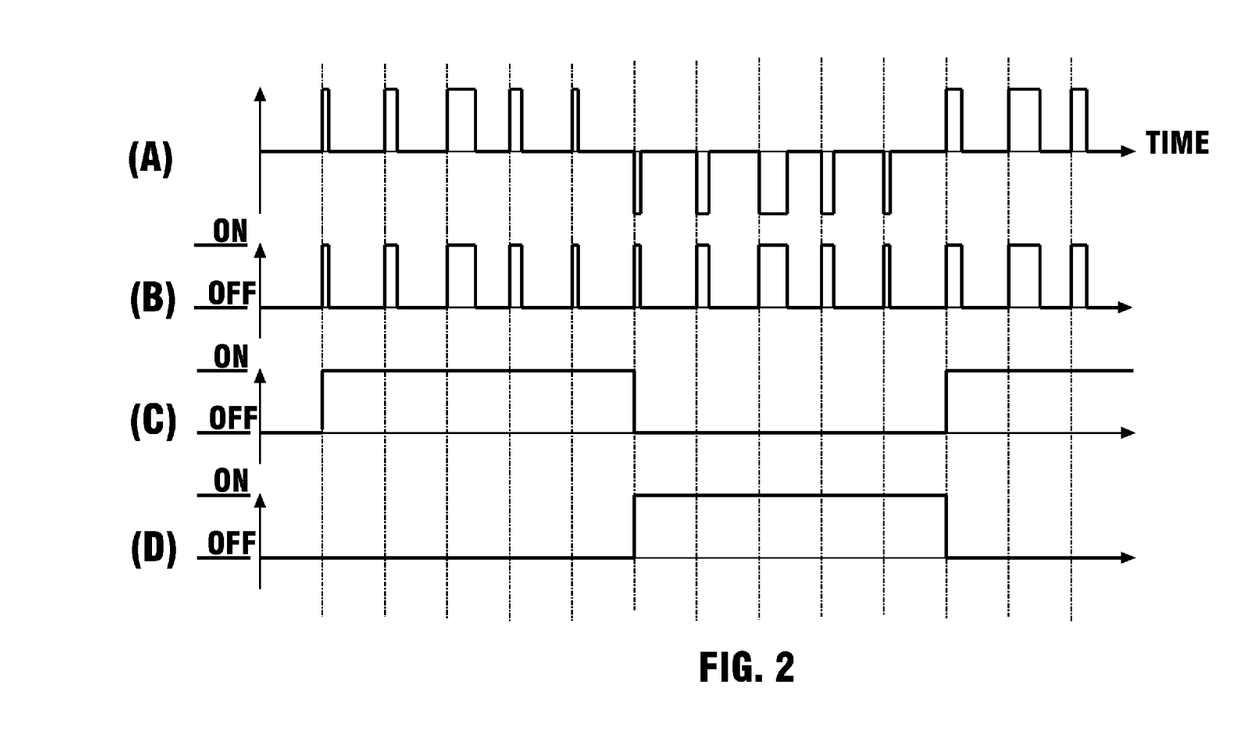
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switching unit 101 for controlling its switching are illustrated in FIG. 2(B). Also according to the pulse modulated signal illustrated in FIG. 2(A), a non-limiting exemplary waveform of switching control signals from the switching control unit 105C to the switches 104A, 104C are illustrated in FIG. 2(C); and a non-limiting exemplary waveforms of switching control signals from the switching control unit 105C to the switches 104B, 104D are illustrated in FIG. 2(D).

Accordingly, as illustrated in FIG. 1 and FIG. 2, when the input signal 106 is zero, the switches of the switching unit 101 and the switching power transmitting unit 104 are all switched off.

When the input signal 106 is not zero, the switching unit 101 switched a pulsed voltage from the direct current (DC) voltage 109 according to the pulse modulated signal pulse modulated from the input signal 106. And when the polarity of the pulse modulated signal FIG. 2(A) is positive, the switches 104A, 104C switch on to conduct the pulsed voltage to the filter unit 107 positively; otherwise, when the polarity of the pulse modulated signal FIG. 2(A) is negative, the switches 104B and 104D switch on to conduct the pulsed voltage to the filter unit 107 negatively, wherein the free-wheeling diode unit 102 provides a current path for keeping a current flow through the inductors of the filter unit 107 during the switching off period of the switching unit 101, thus for keeping energy transmission from the pulsed voltage through the filter unit 107 to the output signal 108 continuously.

As further illustrated in FIG. 1, the filter unit 107 is a low pass filter to obtain the output signal 108 corresponding to the input signal 106 by filtering the pulsed voltage positively or negatively conducted from the switching power transmitting unit 104 and outputting the output signal 108.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
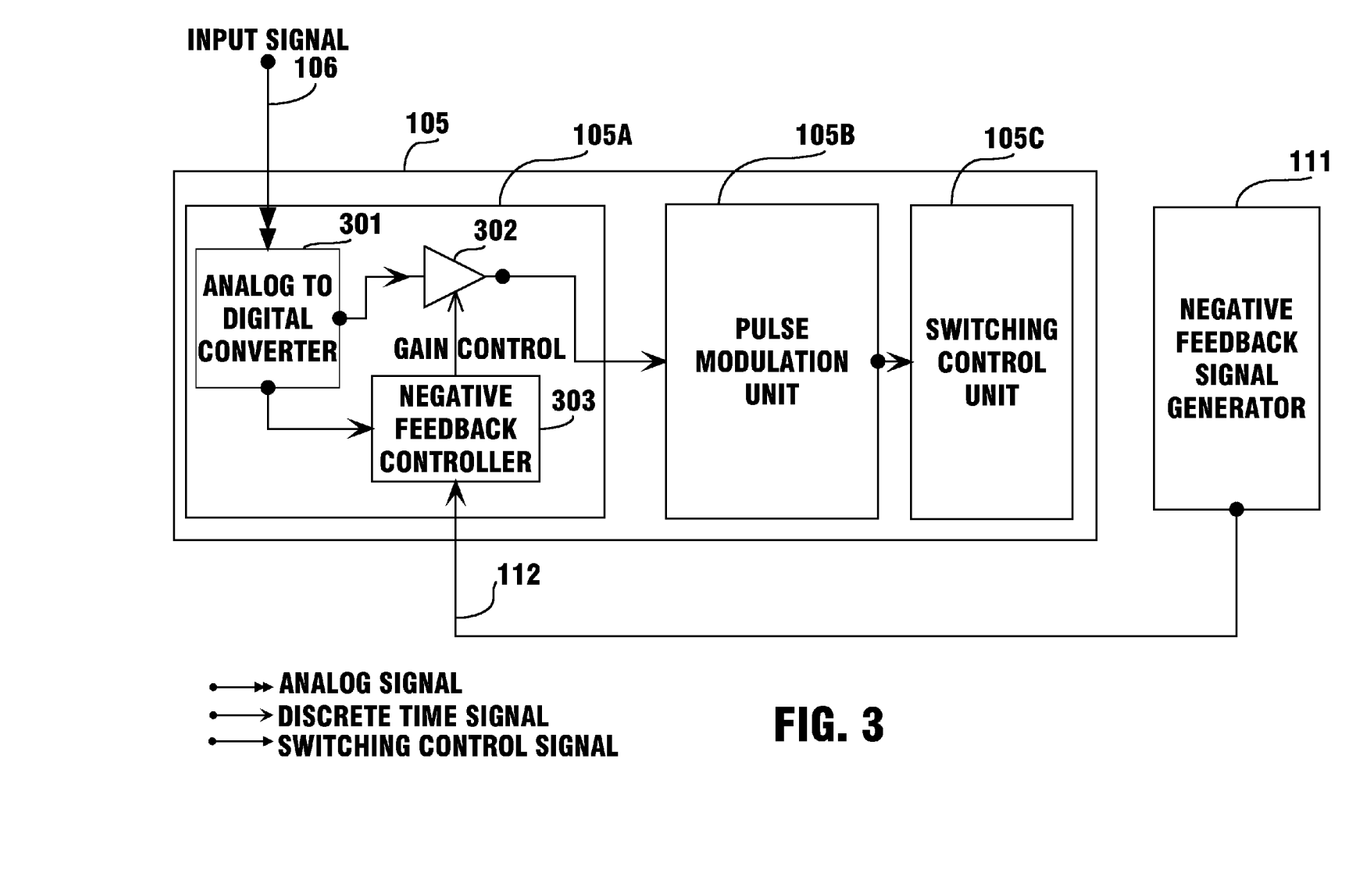
FIG. 3 is an exemplary block and circuit diagram illustrating an embodiment of the amplifier control unit integrating an input signal and a negative feedback signal in FIG. 1, 4, 5 in accordance with the present invention.

FIG. 3 is an exemplary block and circuit diagram illustrating an embodiment of the amplifier control unit 105 integrating the input signal 106 and a negative feedback signal 112 in FIG. 1, 4, 5 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\},\ 0<n<\infty;$$

The linear digital transformer 302 transforms the discrete time input signal x[n] by multiplying a gain G to the discrete time input signal (the default value of the gain G is 1):

$$X[n]=\{G\times x[n]\},\ 0<n<\infty$$

to get a compensated discrete time input signal X[n] and sends the compensated discrete time input signal X[n] to the pulse modulation unit 105B.

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

As further illustrated in FIG. 1, the amplifier control unit 105 of the switching amplifier 100 integrates the input signal 106 and the negative feedback signal 112 to process a negative feedback control. Accordingly, with the negative feedback control, the slave output signal 110 trends to track the output signal 108 for the direct current (DC) voltage 109 and load changes. Therefore, the switching amplifier 100 provides multiple output signals are substantially immune to power supply and load perturbations.

Figure 4:
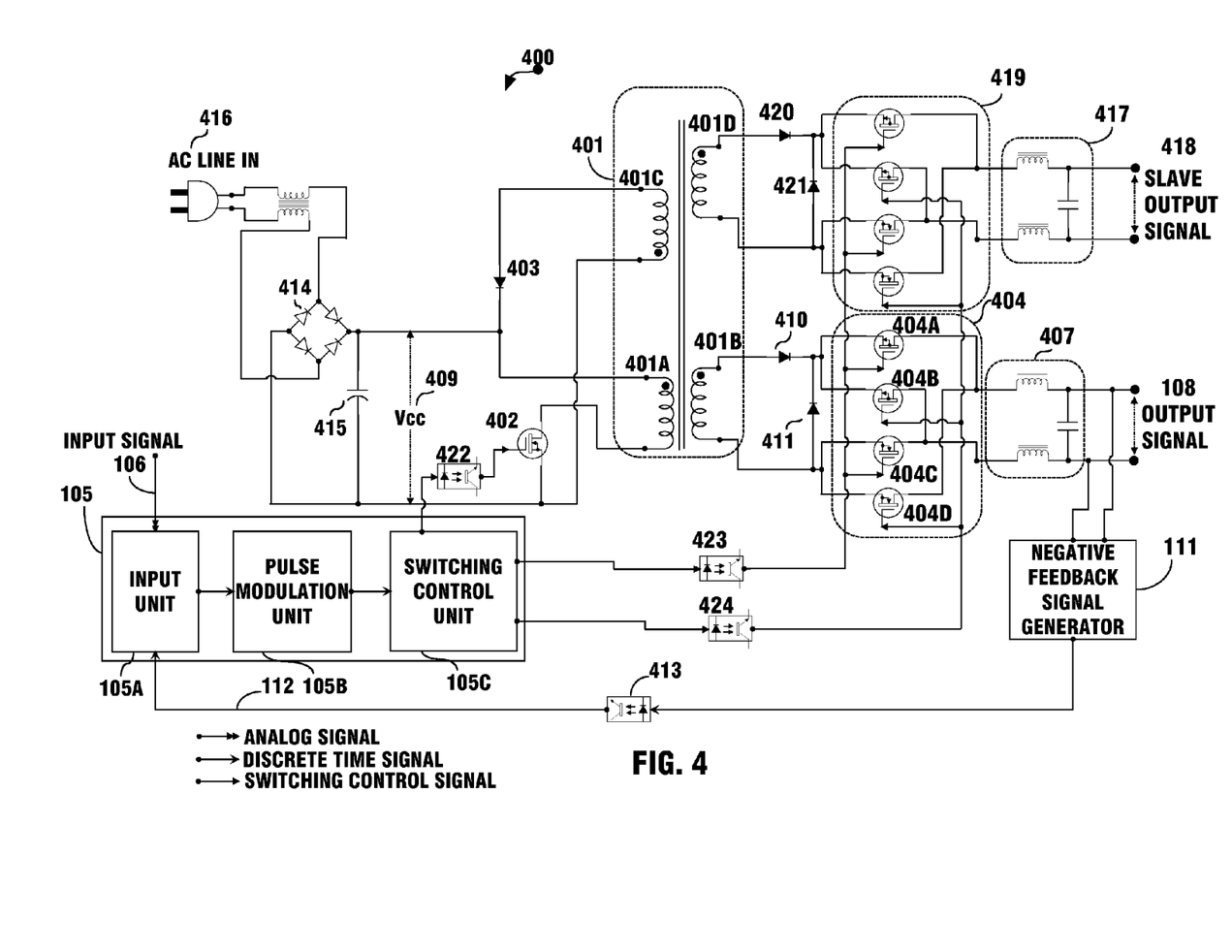
FIG. 4 is an exemplary block and circuit diagram illustrating a second embodiment of a switching amplifier in accordance with the present invention.

FIG. 4 is an exemplary block and circuit diagram illustrating a second embodiment of a switching amplifier 400 in accordance with the present invention.

As illustrated in FIG. 4, the switching amplifier 400 of the present invention for obtaining an output signal 108 from a direct current (DC) voltage 409, wherein the output signal 108 is a linearly amplified replica of an input signal 106 having first and second polarities is comprised of: a switching unit 402 for switching a pulsed voltage from the direct current (DC) voltage 409; a free-wheeling diode unit 411 for providing a current path for transmitting energy from the pulsed voltage to the output signal 108 during the switching off period of the switching unit 402; a switching power transmitting unit 404 for positively or negatively conducting the pulsed voltage to a filter unit 407, wherein the switching power transmitting unit 404 comprises a plurality of switches 404A, 404B, 404C, 404D; an amplifier control unit 105 for receiving the input signal 106 and coupled to the switches of the switching unit 402 and the switching power transmitting unit 404 to control their switching according to the input signal 108; the filter unit 407 to obtain the output signal 108 corresponding to the input signal 106 by filtering the pulsed voltage positively or negatively conducted from the switching power transmitting unit 404 and outputting the output signal 108; a transformer 401 comprising a primary winding 401A, a secondary winding unit 401B comprising a secondary winding and a reset winding 401C for resetting the flux in the core of the transformer 401 to its rest value by transforming the energy of parasitic inductance from the transformer 401 to the direct current (DC) voltage 409 during the switching off period of the switching unit 402, wherein the transformer 401 is coupled between the switching unit 402 and the free-wheeling diode unit 411 for isolating the direct current (DC) voltage 409 and the output signal 108, also for stepping up or down the pulsed voltage, wherein the primary winding 401A is coupled to the switching unit 402 and the switching power transmitting unit 404 is coupled to the secondary winding unit 401B and the free-wheeling diode unit 411; a rectifier diode means 410 coupled to the secondary winding unit 401B and the free-wheeling diode means 411 for blocking energy transmitted from the secondary winding unit 401B to the switching power transmitting unit 404 during the switching off period of the switching unit 402.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 4, the amplifier control unit 105 comprises an input unit 105A for receiving the input signal 106 and having an analog to digital converter for converting the input signal 106 to a discrete time input signal x[n]

$$x=\{x[n]\},\ 0<n<\infty;$$

a pulse modulation unit 105B for getting a pulse modulated signal from pulse modulating the discrete time input signal x[n]; and a switching control unit 105C coupled to the switches of the switching unit 402 and the switching power transmitting unit 404 to control their switching according to the pulse modulated signal from the pulse modulation unit 105B.

In this non-limiting exemplary embodiment 400, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 4 and FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switching unit 402 for controlling its switching are illustrated in FIG. 2(B). Also according to the pulse modulated signal illustrated in FIG. 2(A), a non-limiting exemplary waveform of switching control signals from the switching control unit 105C to the switches 404A, 404C are illustrated in FIG. 2(C); and a non-limiting exemplary waveforms of switching control signals from the switching control unit 105C to the switches 404B, 404D are illustrated in FIG. 2(D).

Accordingly, as illustrated in FIG. 4 and FIG. 2, when the input signal 106 is zero, the switches of the switching unit 402 and the switching power transmitting unit 404 are all switched off.

When the input signal 106 is not zero, the switching unit 402 switched a pulsed voltage from the direct current (DC) voltage 409 according to the pulse modulated signal pulse modulated from the input signal 106. And when the polarity of the pulse modulated signal FIG. 2(A) is positive, the switches 404A, 404C switch on to conduct the pulsed voltage to the filter unit 407 positively; otherwise, when the polarity of the pulse modulated signal FIG. 2(A) is negative, the switches 404B and 404D switch on to conduct the pulsed voltage to the filter unit 407 negatively, wherein the free-wheeling diode unit 411 provides a current path for keeping a current flow through the inductors of the filter unit 407 during the switching off period of the switching unit 402, thus for keeping energy transmission from the pulsed voltage through the filter unit 407 to the output signal 108 continuously.

As further illustrated in FIG. 4, the filter unit 407 is a low pass filter to obtain the output signal 108 corresponding to the input signal 106 by filtering the pulsed voltage positively or negatively conducted from the switching power transmitting unit 404 and outputting the output signal 108.

As further illustrated in FIG. 4, the switching amplifier 400 of the present invention further comprises: one or more than one slave switching power transmitting units 419, free-wheeling diode units 421, and rectifier diode means 420 that couple to their corresponding slave secondary winding unit 401D of the transformer 401 for getting slave output signals 418 corresponding to the input signal 106, wherein the transformer 401 further comprising one or more than one slave secondary winding units 401D, that each slave secondary winding unit 401D is for obtaining a corresponding slave output signal 418.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 4, the amplifier control unit 105 of the switching amplifier 400 integrates the input signal 106 and the negative feedback signal 112 to process a negative feedback control. Accordingly, with the negative feedback control, the slave output signal 418 trends to track the output signal 108 for the direct current (DC) voltage 409 and load changes. Therefore, the switching amplifier 400 provides multiple output signals are substantially immune to power supply and load perturbations.

As further illustrated in FIG. 4, the switching amplifier 400 of the present invention further comprises: a rectifying and smoothing unit 414, 415 to rectify and smooth an alternating current (AC) voltage 416 and to provide the direct current (DC) voltage 409.

As further illustrated in FIG. 4, the switching amplifier 400 further comprises a photo coupler 413 coupled between the negative feedback signal generator 111 and the amplifier control unit 105 to provide electric isolation between the negative feedback signal generator 111 and the amplifier control unit 105.

As further illustrated in FIG. 4, the switching amplifier 400 further comprises isolator circuits 422 coupled between the switching unit 402 and the amplifier control unit 105 to provide electric isolation between the switching unit 402 and the amplifier control unit 105.

As further illustrated in FIG. 4, the switching amplifier 400 further comprises isolator circuits 423, 424 coupled between the switching power transmitting unit 404 and the amplifier control unit 105 to provide electric isolation between the switching power transmitting unit 404 and the amplifier control unit 105.

As further illustrated in FIG. 4, the switching amplifier 400 further comprises isolator circuits 423, 424 coupled between the slave switching power transmitting units 419 corresponding to slave output signals 418 and the amplifier control unit 105 to provide electric isolation between the slave switching power transmitting units 419 and the amplifier control unit 105.

Figure 5:
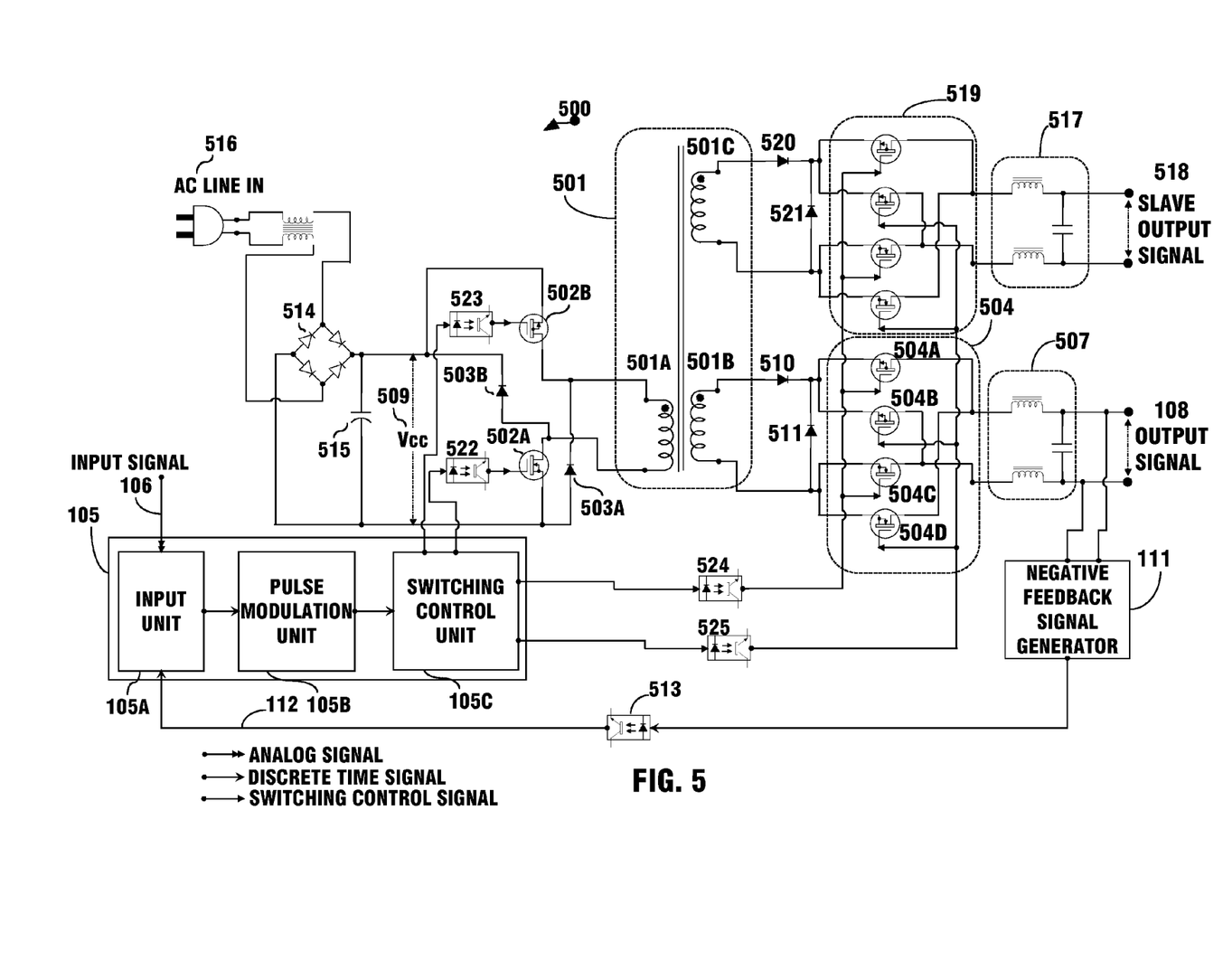
FIG. 5 is an exemplary block and circuit diagram illustrating a third embodiment of a switching amplifier in accordance with the present invention.

FIG. 5 is an exemplary block and circuit diagram illustrating a third embodiment of a switching amplifier in accordance with the present invention.

As illustrated in FIG. 5, the switching amplifier 500 of the present invention for obtaining an output signal 108 from a direct current (DC) voltage 509, wherein the output signal 108 is a linearly amplified replica of an input signal 106 having first and second polarities is comprised of: a switching unit 502A, 502B for switching a pulsed voltage from the direct current (DC) voltage 509; a free-wheeling diode unit 511 for providing a current path for transmitting energy from the pulsed voltage to the output signal 108 during the switching off period of the switching unit 502A, 502B; a switching power transmitting unit 504 for positively or negatively conducting the pulsed voltage to a filter unit 507, wherein the switching power transmitting unit 504 comprises a plurality of switches 504A, 504B, 504C, 504D; an amplifier control unit 105 for receiving the input signal 106 and coupled to the switches of the switching unit 502A, 502B and the switching power transmitting unit 504 to control their switching according to the input signal 108; the filter unit 507 to obtain the output signal 108 corresponding to the input signal 106 by filtering the pulsed voltage positively or negatively conducted from the switching power transmitting unit 504 and outputting the output signal 108; a transformer 501 comprising a primary winding 501A, a secondary winding unit 501B comprising a secondary winding and two diode means 503A, 503B for resetting the flux in the core of the transformer 501 to its rest value by transforming the energy of parasitic inductance from the transformer 501 to the direct current (DC) voltage 509 during the switching off period of the switching unit 502A, 502B, wherein the transformer 501 is coupled between the switching unit 502A, 502B and the free-wheeling diode unit 511 for isolating the direct current (DC) voltage 509 and the output signal 108, also for stepping up or down the pulsed voltage, wherein the primary winding 501A is coupled to the switching unit 502A, 502B and the switching power transmitting unit 504 is coupled to the secondary winding unit 501B and the free-wheeling diode unit 511; a rectifier diode means 510 coupled to the secondary winding unit 501B and the free-wheeling diode means 511 for blocking energy transmitted from the secondary winding unit 501B to the switching power transmitting unit 504 during the switching off period of the switching unit 502A, 502B.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 5, the amplifier control unit 105 comprises an input unit 105A for receiving the input signal 106 and having an analog to digital converter for converting the input signal 106 to a discrete time input signal x[n]

$x=\{x[n]\},\ 0<n<\infty;$ a pulse modulation unit 105B for getting a pulse modulated signal from pulse modulating the discrete time input signal x[n]; and a switching control unit 105C coupled to the switches of the switching unit 502A, 502B and the switching power transmitting unit 504 to control their switching according to the pulse modulated signal from the pulse modulation unit 105B.

In this non-limiting exemplary embodiment 500, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 5 and FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switching unit 502A, 502B for controlling its switching are illustrated in FIG. 2(B). Also according to the pulse modulated signal illustrated in FIG. 2(A), a non-limiting exemplary waveform of switching control signals from the switching control unit 105C to the switches 504A, 504C are illustrated in FIG. 2(C); and a non-limiting exemplary waveforms of switching control signals from the switching control unit 105C to the switches 504B, 504D are illustrated in FIG. 2(D).

Accordingly, as illustrated in FIG. 5 and FIG. 2, when the input signal 106 is zero, the switches of the switching unit 502A, 502B and the switching power transmitting unit 504 are all switched off.

When the input signal 106 is not zero, the switching unit 502A, 502B switched a pulsed voltage from the direct current (DC) voltage 509 according to the pulse modulated signal pulse modulated from the input signal 106. And when the polarity of the pulse modulated signal FIG. 2(A) is positive, the switches 504A, 504C switch on to conduct the pulsed voltage to the filter unit 507 positively; otherwise, when the polarity of the pulse modulated signal FIG. 2(A) is negative, the switches 504B and 504D switch on to conduct the pulsed voltage to the filter unit 507 negatively, wherein the free-wheeling diode unit 511 provides a current path for keeping a current flow through the inductors of the filter unit 507 during the switching off period of the switching unit 502A, 502B, thus for keeping energy transmission from the pulsed voltage through the filter unit 507 to the output signal 108 continuously.

As further illustrated in FIG. 5, the filter unit 507 is a low pass filter to obtain the output signal 108 corresponding to the input signal 106 by filtering the pulsed voltage positively or negatively conducted from the switching power transmitting unit 504 and outputting the output signal 108.

As further illustrated in FIG. 5, the switching amplifier 500 of the present invention further comprises: one or more than one slave switching power transmitting units 519, free-wheeling diode units 521, and rectifier diode means 520 that couple to their corresponding slave secondary winding unit 501C of the transformer 501 for getting slave output signals 518 corresponding to the input signal 106, wherein the transformer 501 further comprising one or more than one slave secondary winding units 501C, that each slave secondary winding unit 501C is for obtaining a corresponding slave output signal 518.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 5, the amplifier control unit 105 of the switching amplifier 500 integrates the input signal 106 and the negative feedback signal 112 to process a negative feedback control. Accordingly, with the negative feedback control, the slave output signal 518 trends to track the output signal 108 for the direct current (DC) voltage 509 and load changes. Therefore, the switching amplifier 500 provides multiple output signals are substantially immune to power supply and load perturbations.

As further illustrated in FIG. 5, the switching amplifier 500 of the present invention further comprises: a rectifying and smoothing unit 514, 515 to rectify and smooth an alternating current (AC) voltage 516 and to provide the direct current (DC) voltage 509.

As further illustrated in FIG. 5, the switching amplifier 500 further comprises a photo coupler 513 coupled between the negative feedback signal generator 111 and the amplifier control unit 105 to provide electric isolation between the negative feedback signal generator 111 and the amplifier control unit 105.

As further illustrated in FIG. 5, the switching amplifier 500 further comprises isolator circuits 522, 523 coupled between the switching unit 502A, 502B and the amplifier control unit 105 to provide electric isolation between the switching unit 502A, 502B and the amplifier control unit 105.

As further illustrated in FIG. 5, the switching amplifier 500 further comprises isolator circuits 524, 525 coupled between the switching power transmitting unit 504 and the amplifier control unit 105 to provide electric isolation between the switching power transmitting unit 504 and the amplifier control unit 105.

As further illustrated in FIG. 5, the switching amplifier 500 further comprises isolator circuits 524, 525 coupled between the slave switching power transmitting units 519 corresponding to slave output signals 518 and the amplifier control unit 105 to provide electric isolation between the slave switching power transmitting units 519 and the amplifier control unit 105.

Figure 6:
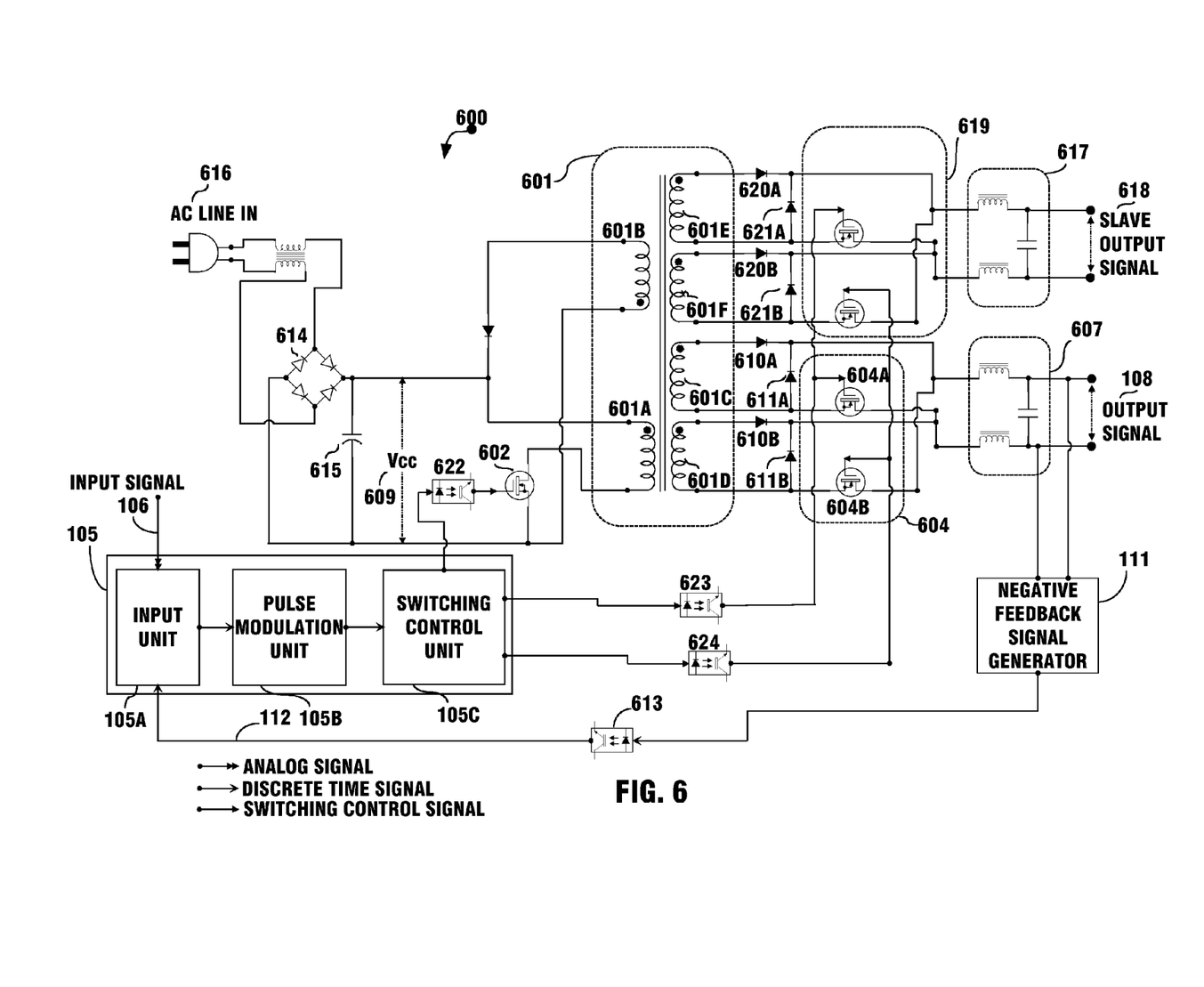
FIG. 6 is an exemplary block and circuit diagram illustrating a fourth embodiment of a switching amplifier in accordance with the present invention.

FIG. 6 is an exemplary block and circuit diagram illustrating a fourth embodiment of a switching amplifier in accordance with the present invention.

As illustrated in FIG. 6, the switching amplifier 600 of the present invention for obtaining an output signal 108 from a direct current (DC) voltage 609, wherein the output signal 108 is a linearly amplified replica of an input signal 106 having first and second polarities is comprised of: a switching unit 602 for switching a pulsed voltage from the direct current (DC) voltage 609; a free-wheeling diode unit comprising two diode means 611A, 611B for providing a current path for transmitting energy from the pulsed voltage to the output signal 108 during the switching off period of the switching unit 602; a switching power transmitting unit 404 for positively or negatively conducting the pulsed voltage to a filter unit 607, wherein the switching power transmitting unit 604 comprises a plurality of switches 604A, 604B; an amplifier control unit 105 for receiving the input signal 106 and coupled to the switches of the switching unit 602 and the switching power transmitting unit 604 to control their switching according to the input signal 108; the filter unit 607 to obtain the output signal 108 corresponding to the input signal 106 by filtering the pulsed voltage positively or negatively conducted from the switching power transmitting unit 604 and outputting the output signal 108; a transformer 601 comprising a primary winding 601A, a secondary winding unit comprising two secondary windings 601C, 601D and a reset winding 601B for resetting the flux in the core of the transformer 601 to its rest value by transforming the energy of parasitic inductance from the transformer 601 to the direct current (DC) voltage 609 during the switching off period of the switching unit 602, wherein the transformer 601 is coupled between the switching unit 602 and the free-wheeling diode unit 611A, 611B for isolating the direct current (DC) voltage 409 and the output signal 108, also for stepping up or down the pulsed voltage, wherein the primary winding 601A is coupled to the switching unit 602 and the switching power transmitting unit 604 is coupled to the secondary winding unit 601C, 601D and the free-wheeling diode unit 611A, 611B; two rectifier diode means 610A, 610B coupled to the secondary winding unit 601C, 601D and the free-wheeling diode unit 611A, 611B for blocking energy transmitted from the secondary winding unit 601C, 601D to the switching power transmitting unit 604 during the switching off period of the switching unit 602.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 6, the amplifier control unit 105 comprises an input unit 105A for receiving the input signal 106 and having an analog to digital converter for converting the input signal 106 to a discrete time input signal x[n]

$x=\{x[n]\}, 0<n<\infty;$ a pulse modulation unit 105B for getting a pulse modulated signal from pulse modulating the discrete time input signal x[n]; and a switching control unit 105C coupled to the switches of the switching unit 602 and the switching power transmitting unit 604 to control their switching according to the pulse modulated signal from the pulse modulation unit 105B.

In this non-limiting exemplary embodiment 600, the amplifier control unit 105 is a digital signal processing circuit. And it is obvious for a corresponding embodiment of an analog signal processing circuit for the amplifier control unit 105 in accordance with this invention by using an input unit for receiving an analog input signal and a pulse modulator for pulse modulating said analog input signal.

As illustrated in FIG. 6 and FIG. 2, a non-limiting exemplary waveform for the pulse modulated signal from the pulse modulation unit 105B is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105C to the switching unit 602 for controlling its switching are illustrated in FIG. 2(B). Also according to the pulse modulated signal illustrated in FIG. 2(A), a non-limiting exemplary waveform of switching control signals from the switching control unit 105C to the switch 604A is illustrated in FIG. 2(C); and a non-limiting exemplary waveforms of switching control signals from the switching control unit 105C to the switches 604B is illustrated in FIG. 2(D).

Accordingly, as illustrated in FIG. 6 and FIG. 2, when the input signal 106 is zero, the switches of the switching unit 602 and the switching power transmitting unit 604 are all switched off.

When the input signal 106 is not zero, the switching unit 602 switched a pulsed voltage from the direct current (DC) voltage 609 according to the pulse modulated signal pulse modulated from the input signal 106. And when the polarity of the pulse modulated signal FIG. 2(A) is positive, the switch 604A switches on to conduct the pulsed voltage to the filter unit 407 positively; otherwise, when the polarity of the pulse modulated signal FIG. 2(A) is negative, the switch 604B switches on to conduct the pulsed voltage to the filter unit 407 negatively, wherein the free-wheeling diode unit 611A, 611B provides current paths for keeping a current flow through the inductors of the filter unit 607 during the switching off period of the switching unit 602, thus for keeping energy transmission from the pulsed voltage through the filter unit 607 to the output signal 108 continuously.

As further illustrated in FIG. 6, the filter unit 607 is a low pass filter to obtain the output signal 108 corresponding to the input signal 106 by filtering the pulsed voltage positively or negatively conducted from the switching power transmitting unit 604 and outputting the output signal 108.

As further illustrated in FIG. 6, the switching amplifier 600 of the present invention further comprises: one or more than one slave switching power transmitting units 619, free-wheeling diode units 621A, 621B, and rectifier diode means 620A, 620B that couple to their corresponding slave secondary winding unit 601E, 601F of the transformer 601 for getting slave output signals 618 corresponding to the input signal 106, wherein the transformer 601 further comprising one or more than one slave secondary winding units 601E, 601F, that each slave secondary winding unit 601E, 601F is for obtaining a corresponding slave output signal 618.

As further illustrated in FIG. 6, the switching amplifier 600 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 6, the amplifier control unit 105 of the switching amplifier 600 integrates the input signal 106 and the negative feedback signal 112 to process a negative feedback control. Accordingly, with the negative feedback control, the slave output signal 618 trends to track the output signal 108 for the direct current (DC) voltage 609 and load changes. Therefore, the switching amplifier 600 provides multiple output signals are substantially immune to power supply and load perturbations.

As further illustrated in FIG. 6, the switching amplifier 600 of the present invention further comprises: a rectifying and smoothing unit 614, 615 to rectify and smooth an alternating current (AC) voltage 616 and to provide the direct current (DC) voltage 609.

As further illustrated in FIG. 6, the switching amplifier 600 further comprises a photo coupler 613 coupled between the negative feedback signal generator 111 and the amplifier control unit 105 to provide electric isolation between the negative feedback signal generator 111 and the amplifier control unit 105.

As further illustrated in FIG. 6, the switching amplifier 600 further comprises isolator circuits 622 coupled between the switching unit 602 and the amplifier control unit 105 to provide electric isolation between the switching unit 602 and the amplifier control unit 105.

As further illustrated in FIG. 6, the switching amplifier 600 further comprises isolator circuits 623, 624 coupled between the switching power transmitting unit 604 and the amplifier control unit 105 to provide electric isolation between the switching power transmitting unit 604 and the amplifier control unit 105.

As further illustrated in FIG. 6, the switching amplifier 600 further comprises isolator circuits 623, 624 coupled between the slave switching power transmitting units 619 corresponding to slave output signals 618 and the amplifier control unit 105 to provide electric isolation between the slave switching power transmitting units 619 and the amplifier control unit 105.

From the switching amplifiers 100, 400, 500 and 600 in accordance with the present invention, one aspect of the present invention provides a switching amplifier that is highly efficient and without the "dead time" problem related to the class D amplifiers. Accordingly, the switches of the switching amplifiers 100, 400, 500 and 600 are never short the direct current (DC) voltage through themselves.

From the switching amplifiers 100, 400, 500 and 600 in accordance with the present invention, another aspect of the present invention provides a switching amplifier that is completely off when there is no input signal, as illustrated in FIG. 2.

From the switching amplifiers 400, 500 and 600 in accordance with the present invention, yet another aspect of the present invention provides a switching amplifier for obtaining a plurality of different linearly amplified replicas of the input signal, and adding more outputs easily and economically.

From the switching amplifiers 400, 500 and 600 in accordance with the present invention, yet another aspect of the present invention provides a switching amplifier that isolates the outputs from the power supply, as illustrated in FIGS. 4, 5 and 6.

From the switching amplifiers 100, 400, 500 and 600 in accordance with the present invention, yet another aspect of the present invention provides a switching amplifier which comprised of an act of comparing an input signal with an output feedback signal for detection and correction of overall system signal processes therefore does not require a power supply regulator and is substantially immune to power supply and load perturbations, as illustrated in FIGS. 1, 3, 4, 5 and 6.

From the switching amplifiers 400, 500 and 600 in accordance with the present invention, yet another aspect of the present invention provides a switching amplifier with the negative feedback control that the slave output signals trends to track the output signal for the direct current (DC) voltage and load changes for obtaining multiple output signals are substantially immune to power supply and load perturbations.

It is to be understood that the above described embodiments are merely illustrative of the principles of the invention and that other arrangements may be devised by those skilled in the art without departing from the spirit and scope of the invention.

What is claimed is:

1. A method of obtaining an output signal from a direct current (DC) voltage, wherein the output signal is a linearly amplified replica of an input signal having first and second polarities, comprising the steps of:
   receiving the input signal;
   pulse modulating the input signal for getting a pulse modulated signal;
   switching at least one switch to get a pulsed voltage from the direct current (DC) voltage according to the pulse modulated signal;
   keeping the energy transmission from the pulsed voltage to the output signal during the switching off period of said switching via using at least one free-wheeling diode means coupled to said at least one switch to provide proper current path for the energy transmission;
   conducting said pulsed voltage positively or negatively to a filter according to the polarity of the input signal via a switching power transmitting unit comprising a plurality of switches;
   filtering said pulsed voltage positively or negatively conducted from the switching power transmitting unit for outputting the output signal by the filter.

2. The method of claim 1 further comprising:
   isolating the direct current (DC) voltage and the output signal via a transformer and at least one rectifier diode means coupled between the switch and said at least one free-wheeling diode means, wherein the transformer comprises a primary winding, a secondary winding unit comprising a secondary winding or two secondary windings, and a reset winding or using the primary winding for resetting the flux in the core of the transformer to its rest value by transforming the energy of parasitic inductance from the transformer to the direct current (DC) voltage during the switching off period of said switching; and said at least one rectifier diode means blocks at least one current in the secondary winding unit during the switching off period of said switching.

3. The method of claim 2 further comprising:
   stepping up or down the pulsed voltage through the transformer.

4. The method of claim 1 further comprising:
   obtaining the direct current (DC) voltage from an alternating current (AC) voltage.

5. The method of claim 1 further comprising:
   getting a feedback signal by detecting the output signal and integrating the feedback signal to process a negative feedback control.

6. The method of claim 2 further comprising:
   getting one or more than one slave output signals that are linearly amplified replicas of the input signal using corresponding slave secondary winding units of the transformer, wherein the transformer further comprises one or more than one slave secondary winding units and each slave secondary winding unit comprising a secondary winding or two secondary windings is for generating a corresponding slave output signal.

7. A switching amplifier for obtaining an output signal from a direct current (DC) voltage, wherein the output signal is a linearly amplified replica of an input signal having first and second polarities, said amplifier comprising: a switching unit comprising at least one switch for switching a pulsed voltage from the direct current (DC) voltage;
- a free-wheeling diode unit coupled to the switching unit comprising at least one free-wheeling diode means for providing a current path for transmitting energy from the pulsed voltage to the output signal during the switching off period of the switching unit;
- a switching power transmitting unit for positively or negatively conducting the pulsed voltage to a filter unit, wherein the switching power transmitting unit comprises a plurality of switches;
- an amplifier control unit for receiving the input signal and coupled to the switches of the switching unit and the switching power transmitting unit to control their switching according to the input signal;
- the filter unit to obtain the output signal corresponding to the input signal by filtering said pulsed voltage positively or negatively conducted from the switching power transmitting unit and outputting the output signal.

8. The switching amplifier according to claim 7, further comprising:
- a transformer comprising a primary winding, a secondary winding unit and a reset winding or using the primary winding for resetting the flux in the core of the transformer to its rest value by transforming the energy of parasitic inductance from the transformer to the direct current (DC) voltage during the switching off period of the switching unit;
- at least one rectifier diode means coupled to the secondary winding unit for blocking energy transmitted from the secondary winding unit to the switching power transmitting unit during the switching off period of the switching unit;
- wherein the transformer and said at least one rectifier diode means are coupled between the switching unit and the free-wheeling diode unit for isolating the direct current (DC) voltage and the output signal, or further for stepping up or down the pulsed voltage.

9. The switching amplifier according to claim 8, wherein the secondary winding unit is a secondary winding.

10. The switching amplifier according to claim 8, wherein the secondary winding unit comprises two secondary windings.

11. The switching amplifier according to claim 7, further comprising:
- a rectifying and smoothing unit to rectify and smooth an alternating current (AC) voltage and to provide the direct current (DC) voltage.

12. The switching amplifier according to claim 7, further comprising:
- a negative feedback signal generator to generate a negative feedback signal corresponding to the output signal,
- wherein the amplifier control unit integrates the input signal and the negative feedback signal to process a negative feedback control.

13. The switching amplifier according to claim 11, further comprising:
- an isolator circuit coupled between the negative feedback signal generator and the amplifier control unit to provide electric isolation between the negative feedback signal generator and the amplifier control unit.

14. The switching amplifier according to claim 8, further comprising:
- one or more than one slave switching power transmitting units that each one coupled to its corresponding slave secondary winding unit of the transformer for getting one or more than one slave output signals corresponding to the input signal, wherein the transformer further comprising one or more than one slave secondary winding units comprising one or two secondary windings, that each slave secondary winding unit is for obtaining a corresponding slave output signal;
- wherein the amplifier control unit further couples to the switches of the slave switching power transmitting units to control their switching according to the input signal.

15. The switching amplifier according to claim 7, further comprising:
- isolator circuits coupled between the switching unit and the amplifier control unit to provide electric isolation between the switching unit and the amplifier control unit.

16. The switching amplifier according to claim 7, further comprising:
- isolator circuits coupled between the switching power transmitting unit and the amplifier control unit to provide electric isolation between the switching power transmitting unit and the amplifier control unit.

17. The switching amplifier according to claim 14, further comprising:
- isolator circuits coupled between the slave switching power transmitting units corresponding to slave output signals and the amplifier control unit to provide electric isolation between the slave switching power transmitting units and the amplifier control unit.

18. The switching amplifier according to claim 7, wherein the input signal is an analog signal.

19. The switching amplifier according to claim 7, wherein the input signal is a discrete time signal.

20. The switching amplifier according to claim 7, wherein the filter unit is a low pass filter or a band pass filter or a band stop filter.

* * * * *